US010101397B2

United States Patent
Cooley et al.

(10) Patent No.: US 10,101,397 B2
(45) Date of Patent: Oct. 16, 2018

(54) ELECTRIC VEHICLE CHARGE-RELATED INFORMATION PROCESSING AND DISPLAY

(71) Applicant: GM Global Technology Operations LLC, Detroit, MI (US)

(72) Inventors: Robert B. Cooley, Farmington Hills, MI (US); William M. Hare, Novi, MI (US); Michael A. Assenmacher, Highland, MI (US); Nicholas J. Hainer, Howell, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 995 days.

(21) Appl. No.: 13/746,339

(22) Filed: Jan. 22, 2013

(65) Prior Publication Data

US 2014/0207397 A1    Jul. 24, 2014

(51) Int. Cl.
*G01R 31/36* (2006.01)
*G06F 17/00* (2006.01)
(Continued)

(52) U.S. Cl.
CPC ............ *G01R 31/36* (2013.01); *B60L 3/0046* (2013.01); *B60L 11/1809* (2013.01); *B60L 15/2045* (2013.01); *G06F 17/00* (2013.01); *H01M 10/488* (2013.01); *H02J 7/0021* (2013.01); *H02J 7/0047* (2013.01); *H04Q 9/00* (2013.01); *B60L 2250/16* (2013.01);
(Continued)

(58) Field of Classification Search
CPC .............................. G01R 31/36; B60L 11/1809
See application file for complete search history.

(56) References Cited

U.S. PATENT DOCUMENTS 8,579,635 B2 * 11/2013 Musk .................. B60L 11/1818
439/135
8,975,864 B2    3/2015 Kim
(Continued)

FOREIGN PATENT DOCUMENTS

CN        102164773 A    8/2011
DE    102010029934 A1   12/2011

OTHER PUBLICATIONS

German Office Action for German Application No. 102014100456.6; dated Nov. 3, 2014; 4 pages.
(Continued)

*Primary Examiner* — Manuel A Rivera Vargas
(74) *Attorney, Agent, or Firm* — Cantor Colburn LLP

(57) ABSTRACT

A system includes a vehicle network integrated in an electric vehicle and a display device disposed in the electric vehicle. The display device is communicatively coupled to the vehicle network. The system also includes a computer processor communicatively coupled to the vehicle network and logic executable by the computer processor. The logic is configured to implement a method. The method includes monitoring, over the vehicle network, components relating to a charging function of the electric vehicle and determining from data resulting from the monitoring factors affecting the charging function. The method also includes processing the data to determine an impact of the factors and displaying results of the processing on the display device.

17 Claims, 3 Drawing Sheets

(51) Int. Cl.
   *B60L 11/18*  (2006.01)
   *H02J 7/00*   (2006.01)
   *H01M 10/48*  (2006.01)
   *H04Q 9/00*   (2006.01)
   *B60L 3/00*   (2006.01)
   *B60L 15/20*  (2006.01)

(52) U.S. Cl.
   CPC ........ *H01M 2220/20* (2013.01); *Y02T 10/645* (2013.01); *Y02T 10/7005* (2013.01); *Y02T 10/7055* (2013.01); *Y02T 10/7072* (2013.01); *Y02T 10/72* (2013.01); *Y02T 10/7283* (2013.01); *Y02T 90/14* (2013.01); *Y02T 90/16* (2013.01)

(56) References Cited

U.S. PATENT DOCUMENTS

2010/0094496 A1* 4/2010 Hershkovitz et al. .......... 701/22
2013/0119947 A1* 5/2013 Ishida et al. .................. 320/162

OTHER PUBLICATIONS

Chinese Office Action for CN Application No. 201410028967.0, dated Aug. 14, 2015, pp. 1-10.

* cited by examiner

ELECTRIC VEHICLE CHARGE-RELATED INFORMATION PROCESSING AND DISPLAY

FIELD OF THE INVENTION

The subject invention relates generally to electric-powered or hybrid electric-powered vehicles and, more particularly, to electric vehicle charge-related information processing and display.

BACKGROUND

Vehicle's that derive some or all of their power from an on-board electric storage device (i.e., a battery) may need to be re-charged periodically from an off-board charging source such as a utility grid or another energy source. The amount of time required to acquire such a re-charge (i.e., the charging duration) from an off-board charging source depends upon a number of factors. These factors can have a significant impact not only on the duration of the charge, but also its associated costs. Much of the information related to these factors is not currently available to vehicle operators. If the operators were privy to this information, it might affect their decisions on where, when, and how to re-charge their vehicles. In addition, the ability to acquire this information at the time of vehicle charge may serve to reduce warranty work at the dealerships since, armed with this knowledge, fewer charging issues may be reported.

It is desirable to provide a way to offer vehicle users feedback regarding how particular factors affect charge rates, such that the users may better understand how their charging methods are impacted by these factors, and may take alternative actions when charging their vehicles.

SUMMARY OF THE INVENTION

In one exemplary embodiment of the invention, a system is provided. The system includes a vehicle network integrated in an electric vehicle and a display device disposed in the electric vehicle. The display device is communicatively coupled to the vehicle network. The system also includes a computer processor communicatively coupled to the vehicle network and logic executable by the computer processor. The logic is configured to implement a method. The method includes monitoring, over the vehicle network, components relating to a charging function of the electric vehicle and determining, from data resulting from the monitoring, factors affecting the charging function. The method also includes processing the data to determine an impact of the factors and displaying results of the processing on the display device.

In another exemplary embodiment of the invention, a method is provided. The method includes monitoring, via a computer processor over a vehicle network, components relating to a charging function of an electric vehicle. The method also includes determining, from data resulting from the monitoring, factors affecting the charging function; processing the data to determine an impact of the factors. The method further includes displaying results of the processing on a display device disposed in the electric vehicle.

In a further exemplary embodiment of the invention, a computer program product is provided. The computer program product includes a storage medium having instructions embodied thereon, which when executed by a computer causes the computer to implement a method. The method includes monitoring, over a vehicle network, components relating to a charging function of an electric vehicle. The method also includes determining, from data resulting from the monitoring, factors affecting the charging function; processing the data to determine an impact of the factors. The method further includes displaying results of the processing on a display device disposed in the electric vehicle.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

The following description is merely exemplary in nature and is not intended to limit the present disclosure, its application or uses.

The amount of time required to recharge (i.e., the charging duration) an electrically-powered vehicle or hybrid electric vehicle from an off-board charging source depends upon a number of factors including the amount of charge to be acquired (i.e., the charging quantity), the availability of an off-board charging source, characteristics of the off-board charging source (e.g., the speed at which it can provide a charge, i.e., the charging rate), and characteristics of the on-board battery or batteries (e.g., the rate at which they can accept a charge). The cost associated with re-charging (i.e., the charging cost) may depend upon the charging quantity and other factors, such as the location of the off-board charging source (i.e., the charging location) and the time at which the charge is to be acquired (i.e., the charge time).

Figure 1:
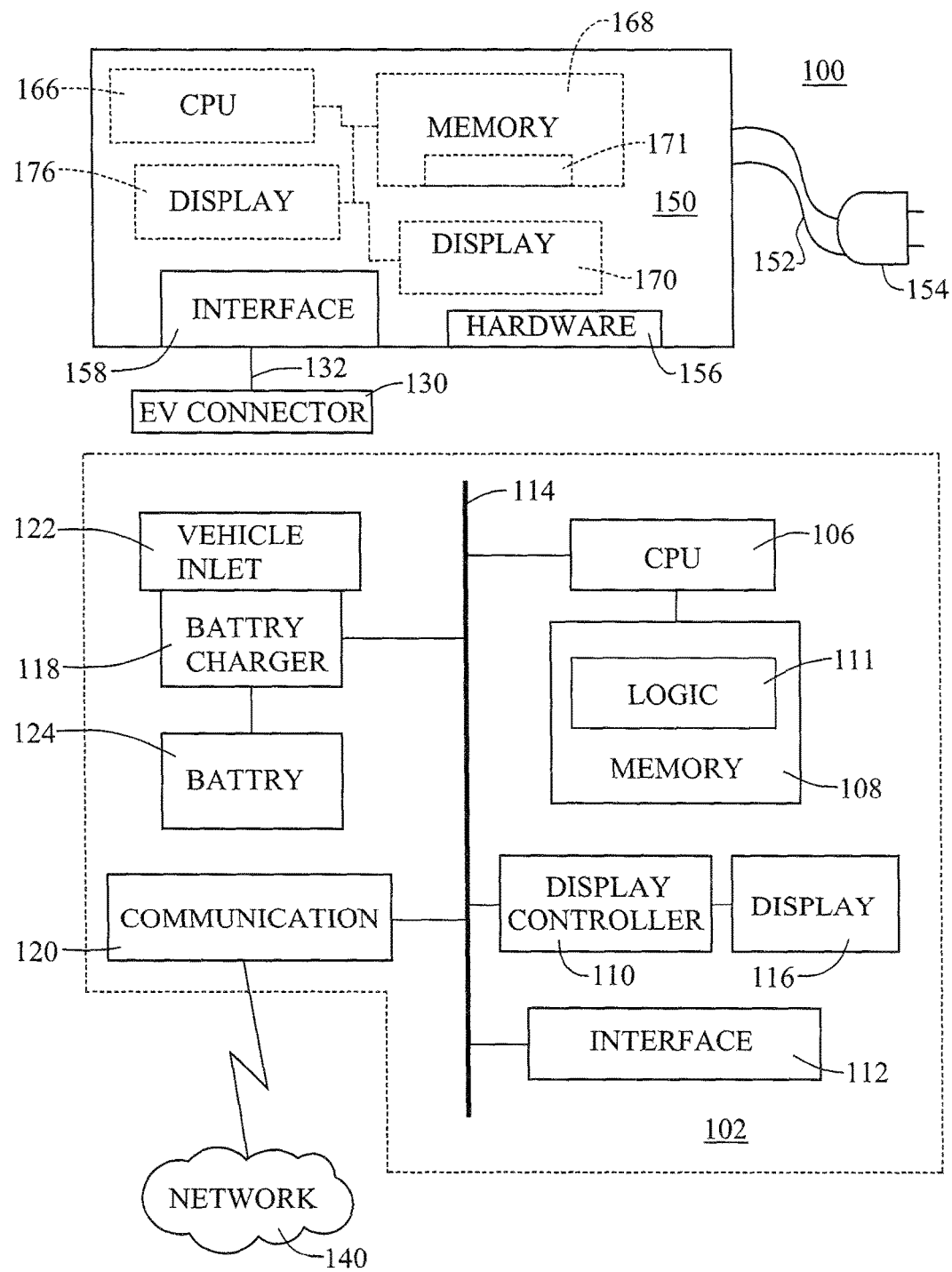
FIG. 1 is a schematic diagram of an exemplary system for providing charge-related impact information for an electrically-powered vehicle in an embodiment of the invention.

An exemplary embodiment of the invention provides vehicle users feedback regarding how particular factors affect charge rates, such that the users may better understand how their charging methods are impacted by these factors, and may take alternative actions when charging their vehicles. The feedback is referred to herein as "charge-related impact information." As shown in FIG. 1, the system 100 includes components of a vehicle 102 and a charging station 150. The vehicle 102 may be any type of electrically-powered or electric hybrid vehicle known in the art. While the system 100 of FIG. 1 illustrates an AC charging system, it will be understood by those skilled in the art that the embodiments are not so limited. For example, other charging systems may be employed to realize the advantages of the exemplary embodiments, such as wireless charging and DC charging systems. Thus, the AC charging system is provided in FIG. 1 for illustrative purposes and is not intended to limit the scope of the invention.

As shown in FIG. 1, the vehicle 102 includes a computer processor 106, memory device 108, a display controller 110, and an operator interface 112, each of which is communicatively coupled to a network bus 114 of the vehicle 102.

The display controller 110, in turn, is communicatively coupled to a display device 116 in the vehicle 102. In an embodiment, the memory device 108 stores logic 111, and the computer processor 106 executes the logic 111 to perform at least a portion of the charge-related impact information processing described herein.

In addition, the vehicle 102 includes a vehicle battery charger 118 and a communication component 120, each of which is also communicatively coupled to the network bus 114. The battery charger 118, in turn, is coupled to a vehicle inlet 122 and a vehicle battery 124.

The computer processor 106 may be implemented, e.g., as an application specific integrated circuit (ASIC), an electronic circuit, or a processor (shared, dedicated, or group). As indicated above, the computer processor 106 executes the logic 111, which may be one or more software or firmware programs, a combinational logic circuit, and/or other suitable components that provide the described functionality. In an embodiment, the computer processor 106 is part of a vehicle control module. The logic 111 processes data from various sources and provides the results (e.g., the charge-related impact information) to the display controller 110 for display on the display device 116.

The memory device 108 may include any type of memory, such as hard disk memory, virtual memory, random access memory, and cache memory.

The display controller 110 may be implemented in hardware, software, or a combination thereof. In an embodiment, the display controller 110 includes a computer processing element that receives inputs from the computer processor 106 over the network bus 114 and presents charge-related impact information on the display device 116 for viewing by an owner or operator of the vehicle 102. The display device 116 may be implemented using any suitable technologies, such as plasma or liquid crystal display technologies. In an embodiment, the display device 116 may be part of a navigation system of the vehicle 102 or may be part of an infotainment system of the vehicle 102. A user interface screen 300 illustrating sample charge-related impact information that is presented on the display device 116 is shown and described in FIG. 3.

The operator interface 112 is configured to receive inputs from an operator of the vehicle 102. The operator interface 112 may include one or more of an interactive display (e.g., where the display device 116 is a touch screen display), indicators, gauges, switches, knobs, touch screen, voice, buttons, dials, and the like. In an embodiment, the operator interface 112 may be part of an onboard navigation system or infotainment system. The operator interface 112 receives operator input and sends the input to the computer processor 106 over the network bus 114. The operator input is described further herein.

The vehicle battery 124 may be a lithium-ion or lithium polymer battery. The vehicle inlet 122 is integrated with the vehicle 102 and is coupled to the battery charger 118. The vehicle inlet 122 provides an entry point for an electric vehicle (EV) connector 130 of a conductive coupling element 132 associated with the charging station 150. In one embodiment, the EV connector 130 is configured to physically couple with the vehicle inlet 122, and when engaged with the vehicle inlet 122, the charging station 150 provides power to the battery charger 118 via the conductive coupling element 132 and EV connector 130.

The network bus 114 is integrated with the vehicle 102 and may be part of a physically wired network, a wireless network, or a combination thereof. In one embodiment, the network bus 114 may be a local area network that communicatively couples electronic components of the vehicle with the computer processor 106. If the network bus 114 is part of a wireline network, the network bus 114 may include one or more serial data buses or other data connections.

The communication component 120 may be implemented as a transceiver, an OnStar™ communication system, cell phone, or similar networked device. The communication component 120 is configured to receive instructions via the operator interface 112, as well as from one or more remote facilities (e.g., over one or more networks 140). To communicate with a remote facility, the computer processor 106 provides information to the communication component 120, which transmits the information to the remote facility over the network(s) 140. Likewise, the communication component 120 may receive information from the remote facility via the network(s) 140 and forward the information to the computer processor 106 over the network bus 114. The remote facilities may include a telematics service provider, such as OnStar, as well as electric power suppliers, as will be described further herein.

The network(s) 140 may be any type of networks known in the art, e.g., satellite, cellular, terrestrial, etc.

The charging station 150 provides current from an electrical power source (e.g., the grid) to the vehicle 102. The charging station 150 includes a power cord 152 having a plug 154 that connects with a power outlet (not shown). The actual components utilized by the charging station 150 may vary based on its type. For example, if the charging station 150 supplies high charge rates (e.g., Level 2) charging, the charging station 150 may include hardware devices 156 that are configured to provide over-current and ground fault protection (e.g., circuit breakers, resistors, etc.). In this embodiment, the power source or circuit may be a 208-240V circuit providing charge rates between 12 and 80 amps. For Level 3 charging, which provides faster charging rates than the Level 2 charging, the charging station 150 may interface with a battery charger (not shown) that is off-board from the vehicle 102 to provide direct charging of the vehicle battery 124. In addition, the charging station 150 may conform to various standards and protocols implemented in different countries. For example, in the United States, components of the charging station 150 may comply with the Society of Automotive Engineers (SAE) and more particularly, SAEJ1772 protocols. If used in the United States or internationally, the charging station 150 may be configured with components that comply with the International Electrotechnical Commission, or IEC. In an embodiment, the charging station 150 may be compliant with GB, or National Standards, adopted in China.

The charging station 150 includes an electrical interface 158 that connects the charging station 150 to the conductive coupling element 132. In one embodiment, the conductive coupling element 132 and the EV connector 130 may be permanently attached to the electrical interface 158 of the charging station 150. Alternatively, the conductive coupling element 132 and the EV connector 130 are removably attached to the electrical interface 158. In the latter embodiment, the conductive coupling element 132 may be supplied by each vehicle operator when engaging with the charging station 150, e.g., when the charging station 150 is configured for public use.

The conductive coupling element 132 includes the EV connector 130 that serves as the interface between the conductive coupling element 132 of the charging station 150 and the vehicle inlet 122 of the vehicle 102. The conductive coupling element 132 may be of various lengths. In an embodiment, the conductive coupling element 132 is approximately 25 feet in length. The conductive coupling element 132 provides the AC current from the charging station 150 to the vehicle 102.

In an alternate embodiment, processing and/or display activities relating to the charge-related impact information may be performed on the charging system 150. In this embodiment, a computer processor 166 is communicatively coupled to a memory device 168, which stores logic 171 for implementing the embodiments described herein. In addition, the charge-related impact information may be provided to a display controller 170, which in turn presents the charge-related impact information on a display device 176 on the charging system 150.

Figure 2:
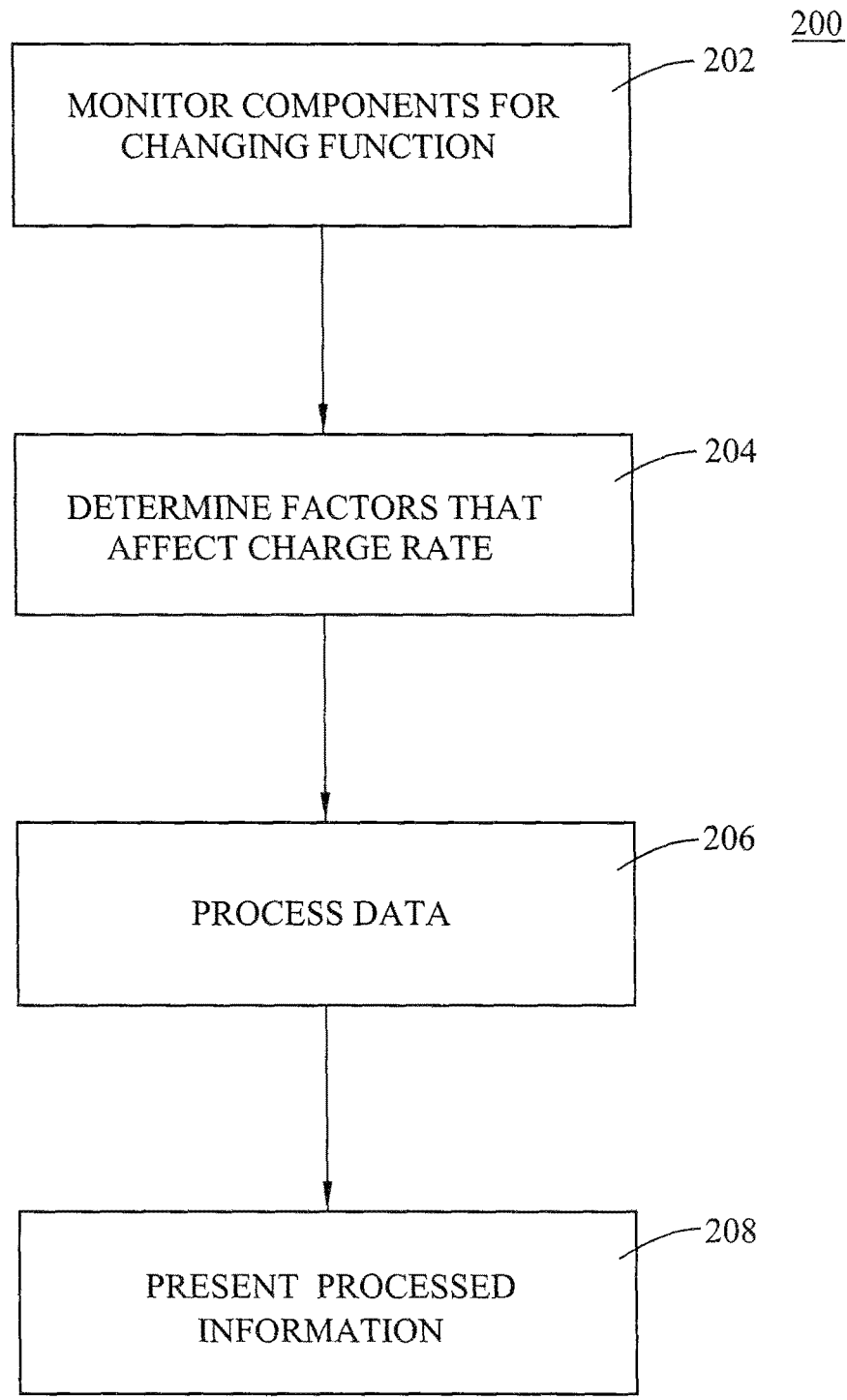
FIG. 2 is a flow chart depicting an exemplary method for providing charge-related impact information for an electrically-powered vehicle in an embodiment of the invention.
Figure 3:
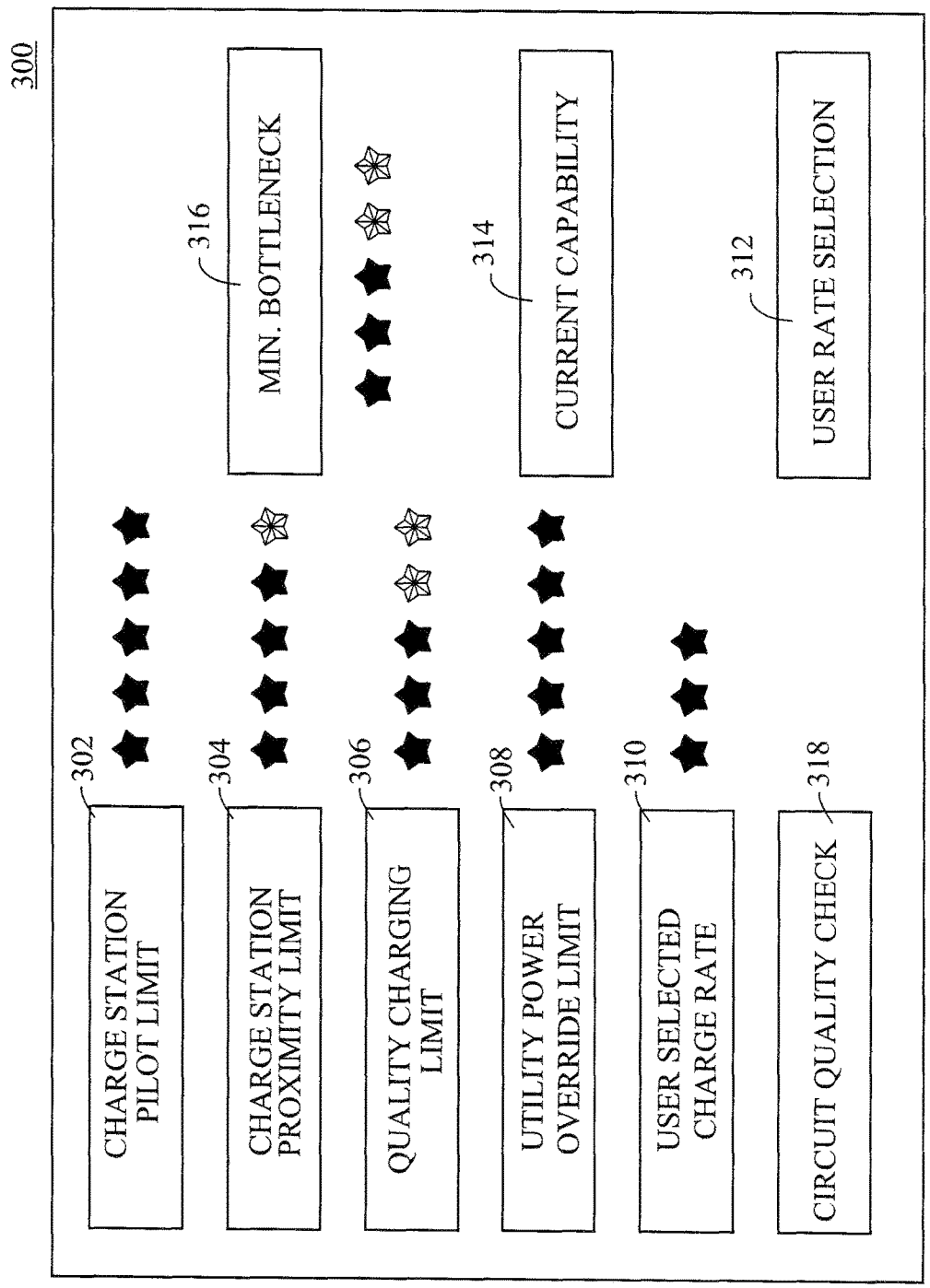
FIG. 3 is an illustration of an exemplary interface screen in an embodiment of the invention.

Turning now to FIGS. 2 and 3, a process 200 and user interface screen 300 for providing charge-related impact information to a vehicle will now be described in an embodiment. In an embodiment, the logic 111 converts quantitative charge-related impact data into a graphical representation that is easily understood by the operator. The graphical representation depicts the data within a spectrum of capabilities (or limits) that range from a least desirable value to a most desirable value. For example, as shown in FIG. 3 for illustrative purposes, the representation of the spectrum is illustrated by five stars and a number of blackened stars represents where the capability lies on the spectrum from least desirable to most desirable. It will be understood that any type of graphical depiction may be used to represent the charge-related impact data and that the use of five stars is provided herein for illustrative purposes and is not to be construed as limiting in scope.

The process of FIG. 2 assumes that the vehicle 102 is physically engaged with the charging system 150 (e.g., the EV connector 130 is physically coupled to the vehicle inlet 122 of the vehicle 102). In an alternative embodiment, the vehicle 102 may be wirelessly coupled to the charging system 150.

At step 202, the logic 111 monitors components for a charging function. The components monitored include the power source, the charging station 150, the conductive coupling element 132, and communications received from the operator interface 112 and the communication component 120. Data received from the monitoring is gathered by the computer processor 106 for processing by the logic 111.

At step 204, the logic 111 determines factors that affect a charge rate from these components based on the data received. The factors may include, but are not limited to, one or more of a charge station pilot limit, a charge cable proximity limit, a circuit quality charging limit, a utility override power limit, user-selected charge rates, and wireless alignment of the vehicle to the charging system. The logic 111 processes data associated with these factors to determine the charge-related information for display on the display device 116 at step 206. Once this information regarding the factors is determined and processed by the logic 111, the processed information is sent to the display controller 110. At step 208, the display controller 110 presents the processed information on the display device 116. In an embodiment, the processed information may be transmitted over the vehicle network 114 to the communication component 120, which may be a hand-held cellular communication device or OnStar communication device integrated in the vehicle 102. Further, the processed information may be transmitted by the communication component 120 over the networks 140 to a remote facility, such as telematics service provider or other entity. The factors and associated monitored data will now be described.

With respect to the charge station pilot limit 302 (FIG. 3), the charging station 150 transmits the current capability of the power source to the vehicle 102. For example, the charging station 150 may indicate the capability of the power source as a maximum of 30 amps. This information is particularly useful when the operator of the vehicle 102 is charging the vehicle 102 at a public charging station where different stations offer different charge rate capabilities. Further, as more than one standard exists (e.g., SAE J1772 and IEC 62196 standards) for recharging electrically-powered vehicles, the logic 111 is configured to identify the standard used in processing the data received with regard to the charge station pilot limit. In an embodiment, when the EV connector 130 is engaged with the vehicle inlet 122, the computer processor 106 sends a pilot signal to the charging station 150. The pilot signal reflects the capability of the power source and indicates one factor that may influence the charging function.

As shown in FIG. 3, the logic 111 converts the capability of the power source to the graphical representation depicting all five stars blackened, which indicates a greatest possible capability. The charge station proximity limit 304 (FIG. 3) is provided when the conductive coupling element 132 (and EV connector 130) is supplied by the vehicle operator (e.g., in Mode 3 operation, the conductive coupling element 132 is removably attached to the charging station 150. The charge station proximity limit reflects the capabilities of the conductive coupling element 132. For example, if the charging station pilot limit is 20 amps and the conductive coupling element limit is 13 amps, the conductive coupling element 132 (e.g., via an internal resistor) informs the vehicle 102 of its capacity. The logic 111 may be configured to utilize the lesser of the two values and provide this information as the charge station proximity limit to the operator via the display device 116. In an embodiment, the logic 111 converts the charge station proximity limit to the graphical representation depicted in FIG. 3.

The circuit quality charging limit 306 (FIG. 3) provides a charge quality of the power being transferred from the power source. For example, in Level 1 charging, a power outlet may be a 110V outlet. In Level 1 or Level 2 charging, the power source may be a dedicated or non-dedicated circuit. If the circuit is non-dedicated, this means the circuit may be shared by other devices, which in turn affects the circuit quality (e.g., may cause voltage drops). The logic 111 receives voltage information from the charging station 150 regarding the current amount of power passing through the charging station 150. The logic 111 may establish a threshold drop level (e.g., 20V) as a measure used in determining an impact value (e.g., a number of blackened stars). Alternatively, the logic 111 may determine any changes in the voltage as a function of current draw (e.g., as a slope). The logic 111 may use this value in determining an impact value (e.g., number of blackened stars). Armed with this information, the operator may choose to select a more reliable circuit to reduce the drop.

The utility override power limit 308 (FIG. 3) is generated from information received from a remote facility via the network(s) 140 and communication component 120. For example, a utility override allows utility companies to communicate with vehicles, e.g., via OnStar. OnStar connects the vehicle operator with a supplier of electricity based on certain identified conditions such as blackout or peak load shedding. GPS or other location data may be used to identify an appropriate supplier for the vehicle 102. The logic 111 receives this information from the communication component 120 over the network bus 114, which is processed to convert the information to conform to the graphical representation and transmits the information to the display controller 110.

If the vehicle 102 is enabled for user-selectable charge rates 310 (FIG. 3), which allows an operator to vary the charging rate, the operator may select this option via the operator interface 112. As shown in FIG. 3, the user may select an option User Rate Selection 312, and the logic 111 may then present two options on the user interface screen 300: Select Maximum Charge Rate and Reduce Charge Rate. The Reduce Charge Rate may be selected, for example, if the operator is aware that he or she is charging a vehicle on a bad circuit, and would like to manually adjust the level of charging (e.g., reduce charge to a selected level). If the charging station 150 is capable of 8 amps and the operator selects 12 amps via the operator interface 112 (e.g., the user selects Select Maximum Charge Rate), the logic 111 selects the minimum of the two values (i.e., 8 amps). As shown in FIG. 3, the overall current capability of the system, e.g., "9 amps" is provided in box 314.

In addition, the logic 111 is configured to calculate the minimum bottleneck in the system, which is provided in box 316. The overall current capability reflected in box 314 reflects the numerical form of the information displayed in box 316. In an embodiment, the logic 111 may also be configured to perform a circuit quality check of a power source in response to operator input to the operator interface 112. As shown in FIG. 3, an option 318 (Circuit Quality Check) enables the operator to select this option and the logic 111, via the computer processor 106, sends a request over the network bus 114 through the charging station 150 to determine the current capability of the power source. The circuit quality information from this request may be converted as described above and indicated as the Circuit Quality Charging Limit 306.

As described above, the invention may be embodied in the form of computer implemented processes and apparatuses for practicing those processes. Embodiments of the invention may also be embodied in the form of computer program code containing instructions embodied in tangible media, such as floppy diskettes, CD-ROMs, hard drives, or any other computer readable storage medium, wherein, when the computer program code is loaded into and executed by a computer, the computer becomes an apparatus for practicing the invention. An embodiment of the invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A system, comprising:
an electric vehicle including an electric vehicle battery;
a vehicle network integrated in the electric vehicle;
a display device disposed in the electric vehicle, the display device communicatively coupled to the vehicle network;
a computer processor communicatively coupled to the vehicle network; and
logic executable by the computer processor, the logic configured to implement a method, the method comprising:
communicating with a charging station configured for charging an electric vehicle battery;
monitoring, over the vehicle network, components relating to a charging function of the charging station, the components including at least one from among a conductive coupling element, a shared power source, a communication component, and an operator interface;
determining, from data resulting from the monitoring, factors affecting the charging function, the factors including one of a charging station proximity limit, a charge station pilot limit, a utility power override limit, a circuit quality charging limit, a wireless alignment of the electric vehicle relative to a charging station, a charge cable proximity limit, and a user selected charge rate;
converting the data received from the charging station to an impact value of the factors affecting the charging function of the charging station;
displaying a graphical representation of the impact value on the display device; and
connecting a vehicle operator to a supplier of energy based on the impact value.

2. The system of claim 1, wherein responsive to the monitoring, the computer processor receives a charge capability from the charging station, the method further comprising:
displaying the charge capability as a graphical representation of a spectrum of values.

3. The system of claim 2, wherein the conductive coupling element is removably attached to the charging station, and responsive to the monitoring the computer processor receives a charge capability of the conductive coupling element, the method further comprising:
determining which of the charging station and the conductive coupling element has the smallest charge rate capability; and
displaying the smallest charge capability as a graphical representation of a spectrum of values.

4. The system of claim 1, wherein the shared power source is communicatively coupled to the electric vehicle, and wherein in response to the monitoring, the computer processor receives voltage information, the voltage information representing one of the factors, the method further comprising:
calculating any drops in voltage from the voltage information.

5. The system of claim 1, wherein responsive to the monitoring, the computer processor receives available supply conditions from a utility supplier via the communication component over a network, the available supply conditions representative of one of the factors.

6. The system of claim 1, wherein the operator interface is communicatively coupled to the vehicle network, and responsive to the monitoring, the computer processor receives an operator-selected charge rate from the operator interface.

7. The system of claim 1, wherein the logic is configured to implement:
transmitting the results of the converting to a cellular device.

8. A method, comprising:
communicating with a charging station configured for charging an electric vehicle battery;
monitoring, via a computer processor over a vehicle network, components relating to a charging function of the charging station;
determining, from data resulting from the monitoring, factors affecting the charging function, the factors including one of a charging station proximity limit, a charge station pilot limit, a utility power override limit, a circuit quality charging limit, a wireless alignment of the electric vehicle relative to a charging station, a charge cable proximity limit, and a user selected charge rate;
processing the data received from the charging station to determine an impact value of the factors relative to a charging capability of the charging station;
displaying results of the charging capability on a display device disposed in the electric vehicle; and
connecting a vehicle operator to a supplier of energy based on the impact value.

9. The method of claim 8, wherein responsive to the monitoring, the computer processor receives a charge capability from the charging station, the charge capability representing one of the factors, the method further comprising:
displaying the charge capability as a graphical representation of a spectrum of values.

10. The method of claim 9, wherein the components further form part of a conductive coupling element that is removably attached to the charging station, and responsive to the monitoring the computer processor receives a charge capability of the conductive coupling element, the method further comprising:
determining which of the charging station and the conductive coupling element has the smallest charge capability; and
displaying the smallest charge rate capability as a graphical representation of a spectrum of values.

11. The method of claim 8, wherein the components form part of a shared power source that is communicatively coupled to the electric vehicle, and wherein in response to the monitoring, the computer processor receives voltage information, the voltage information representing one of the factors, the method further comprising:
calculating any drops in voltage from the voltage information.

12. The method of claim 8, wherein the components form part of a communication component of the electric vehicle, and responsive to the monitoring, the computer processor receives available supply conditions from a utility supplier via the communication component over a network, the available supply conditions representative of one of the factors.

13. The method of claim 8, wherein the components form part of an operator interface that is communicatively coupled to the vehicle network, and responsive to the monitoring, the computer processor receives an operator-selected charge rate from the operator interface.

14. The method of claim 9, further comprising:
transmitting the results of the processing to a cellular device.

15. A non-transitory computer program product comprising a storage medium having instructions embodied thereon, which when executed by a computer processor, cause the computer processor to implement a method, the method comprising:
communicating with a charging station configured for charging an electric vehicle battery;
monitoring, over a vehicle network, components relating to a charging function of the charging station;
determining, from data resulting from the monitoring, factors affecting the charging function, the factors including one of a charging station proximity limit, a charge station pilot limit, a utility power override limit, a circuit quality charging limit, a wireless alignment of the electric vehicle relative to a charging station, a charge cable proximity limit, and a user selected charge rate;
processing the data received from the charging station to determine an impact value of the factors relative to a charging capability of the charging station;
displaying results of the charging capability on a display device disposed in the electric vehicle; and
connecting a vehicle operator to a supplier of energy based on the impact value.

16. The computer program product of claim 15, wherein responsive to the monitoring, the computer processor receives a charge capability from the charging station, the charge capability representing one of the factors, the method further comprising:
displaying the charge capability as a graphical representation of a spectrum of values.

17. The computer program product of claim 16, wherein the components further form part of a conductive coupling element that is removably attached to the charging station, and responsive to the monitoring the computer processor receives a charge capability of the conductive coupling element, the method further comprising:
determining which of the charging station and the conductive coupling element has the smallest charge capability; and
displaying the smallest charge rate capability as a graphical representation of a spectrum of values.

* * * * *